United States Patent [19]

Horiguchi

[11] Patent Number: 5,202,751

[45] Date of Patent: Apr. 13, 1993

[54] SEMICONDUCTOR INTEGRATED CIRCUIT

[75] Inventor: Fumio Horiguchi, Tokyo, Japan

[73] Assignee: Kabushiki Kaisha Toshiba, Kanagawa, Japan

[21] Appl. No.: 905,232

[22] Filed: Jun. 29, 1992

Related U.S. Application Data

[63] Continuation of Ser. No. 425,502, Oct. 20, 1989, abandoned, which is a continuation of Ser. No. 348,125, May 3, 1989, abandoned, which is a continuation of Ser. No. 111,076, Oct. 19, 1987, abandoned, which is a continuation of Ser. No. 717,802, Mar. 29, 1985, abandoned.

[30] Foreign Application Priority Data

Mar. 30, 1984 [JP] Japan .............................. 59-62926

[51] Int. Cl.$^5$ .................... H01L 27/02; H01L 29/68; H01L 23/48
[52] U.S. Cl. .................... 257/532; 257/758; 257/776
[58] Field of Search .............. 357/51, 71, 40, 45, 357/23.6, 59, 68

[56] References Cited

U.S. PATENT DOCUMENTS

| | | | |
|---|---|---|---|
| 4,524,377 | 6/1985 | Eguchi | 357/59 |
| 4,583,111 | 4/1986 | Early | 357/68 |

FOREIGN PATENT DOCUMENTS

| | | |
|---|---|---|
| 0043244 | 1/1982 | European Pat. Off. . |
| 0103362 | 3/1984 | European Pat. Off. . |
| 8022669 | 4/1982 | France . |
| 53-103376 | 8/1978 | Japan .................. 357/51 |
| 2087183 | 5/1982 | United Kingdom . |
| 81/00171 | 1/1981 | World Int. Prop. O. . |

OTHER PUBLICATIONS

K. Itoh et al., "An Experimental 1Mb DRAM with On-Chip Voltage Limiter", IEEE International Solid-State Circuits Conference, Feb. 24, 1984, pp. 282-283.

*Primary Examiner*—Mark V. Prenty
*Attorney, Agent, or Firm*—Finnegan, Henderson, Farabow, Garrett & Dunner

[57] ABSTRACT

A semiconductor integrated circuit having, for instance, a power source side conductor and an earth side conductor which are constructed such that the two conductors are formed into two layers mutually laminated in parallel, and a dielectric substance is interposed between the two layers for providing a capacitance. In this manner, the integrated circuit is operable such that a comparatively large capacitor is connected in the power source circuit thereof.

27 Claims, 4 Drawing Sheets

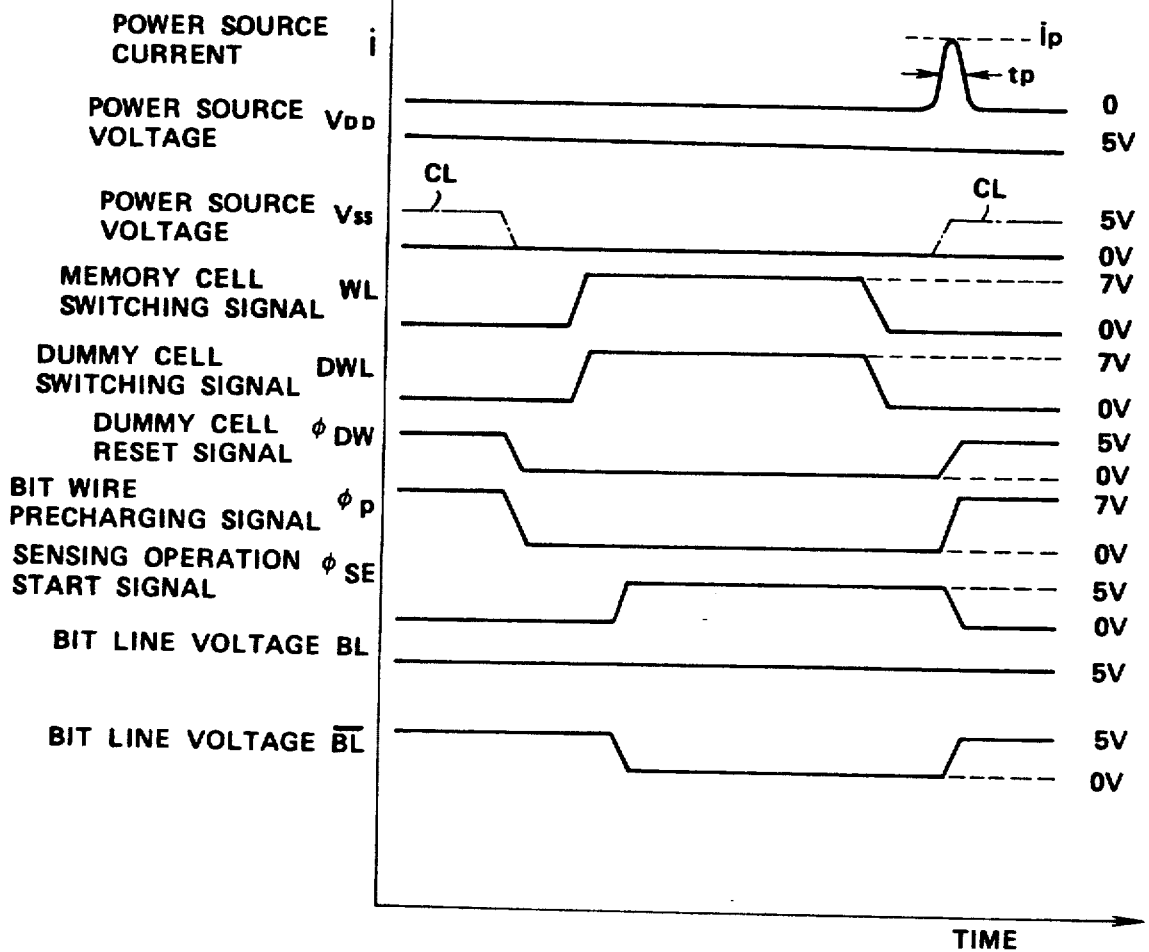
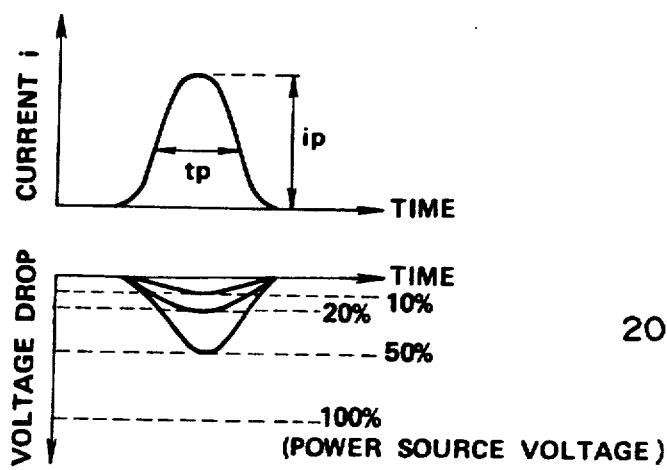
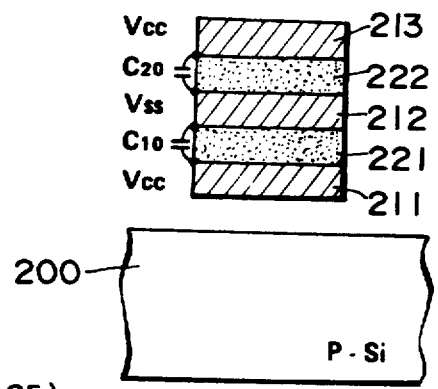

5,202,751

SEMICONDUCTOR INTEGRATED CIRCUIT

This application is a continuation of application Ser. No. 07/425,502 filed Oct. 20, 1989, now abandoned, which is a continuation of application Ser. No. 07/348,125, filed May 3, 1989, now abandoned, which is a continuation of application Ser. No. 07/111,076, filed Oct. 19, 1987, now abandoned, which is a continuation of application Ser. No. 07/717,802, filed Mar. 29, 1985, now abandoned.

BACKGROUND OF THE INVENTION

1. Field of the Invention

This invention relates to a semiconductor integrated circuit, and more particularly to the connection of the power source lines in the integrated circuit.

2. Description of the Prior Art

Ordinarily, a semiconductor integrated circuit includes a multiplicity of semiconductor active elements and two power source lines for supplying electricity to these semiconductor elements, one being a power source voltage line and the other being a ground line.

In the power source lines of a conventional integrated circuit, noise is frequently introduced, not only from outside, but also created therein as a result of the abrupt switching operation of the integrated circuit, thus disturbing the operation of the integrated circuit.

Furthermore, in case of a dynamic RAM of a large memory capacity, such as 256 K bit RAM or 1 M bit RAM, the power source lines become long, and steep current pulses created at the time of the refresh operation in the integrated circuit inevitably caused voltage drops in the long power source lines, thereby rendering the operation of the circuit to be unstable.

SUMMARY OF THE INVENTION

An object of the present invention is to provide a semiconductor integrated circuit wherein the above described difficulties of the conventional circuits can be substantially eliminated.

Another object of the invention is to provide a semiconductor integrated circuit wherein noise occurring in the power source lines can be absorbed effectively and the power source voltage applied to the semiconductor active elements in the circuit can be maintained substantially stable regardless of abrupt change in the current flowing through the integrated circuit.

These and other objects of the present invention can be achieved by a semiconductor integrated circuit wherein at least two connection layers (10, 20) held at different potentials are provided on a substrate (60) formed with a number of semiconductor active elements (40, 50), for leading power source to the elements, characterized in that the two connection layers (10, 20) are laminated in parallel with each other (11, 21 or 12, 22) and a dielectric substance (30) is interposed between the two connection layers (10, 20) for providing a capacitance element (c) therebetween.

With the above described connection construction of the power source lines, a capacitor of a predetermined capacitance is formed between a power source voltage line and an earth line provided by the first and second connection layers, and since the capacitor is provided adjacent to the semiconductor active elements, the capacitor absorbs the noise occurring in the power source lines effectively and supplies a heavy transient current which is required, for example, at the time of charging and discharging of the bit lines of a dynamic RAM. As a consequence, the amount of electric current to be supplied from outside, and hence the variation of the power source voltage, can be substantially reduced. In addition, erroneous operation of the integrated circuit caused by the variation of the power source voltage applied to the active elements of the circuit can be prevented, and a comparatively large operational margin can be allowed for the active elements, thus improving the yield in production of the active elements and reducing the production cost of the semiconductor integrated circuit.

Further, the parallel laminated construction of the first and second connection layers can reduce the space required and hence improve the degree of integration of the integrated circuit.

Ordinarily, when an electric current flows through a power line, a magnetic field is created around the line. The magnetic field defines a self-inductance of the power source line. In recent semiconductor integrated circuits, such as dynamic RAM and the like where long power source lines are required, the self-inductance causes a substantial amount of voltage drop in the power source lines. According to the present invention, since the first and second connection layers are laminated in parallel and electric current flows through these layers oppositely, the magnetic field produced around the first and second layers cancels, and the self-inductance and hence the voltage drop can be reduced to minimum values.

BRIEF DESCRIPTION OF THE DRAWINGS

In the accompanying drawings:

FIG. 9 is a time chart for explaining a sensing operation of the embodiment shown in FIG. 6;

FIG. 10 is a diagram showing an allowable example of voltage drop caused in the power source of a semiconductor integrated circuit of this invention by a transient current flowing into the circuit; and FIG. 11 is a sectional view showing schematically one example of the connecting portion of power source lines in a semiconductor integrated circuit of a multilayer construction, which constitutes still another embodiment of the invention.

DESCRIPTION OF THE PREFERRED EMBODIMENTS

Figure 1:
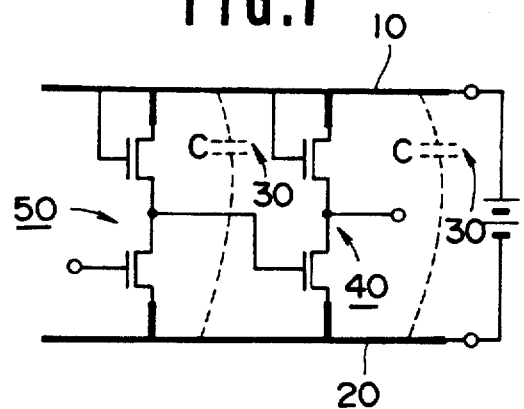
FIG. 1 is an equivalent circuit diagram showing one part of a semiconductor integrated circuit.
Figure 2:
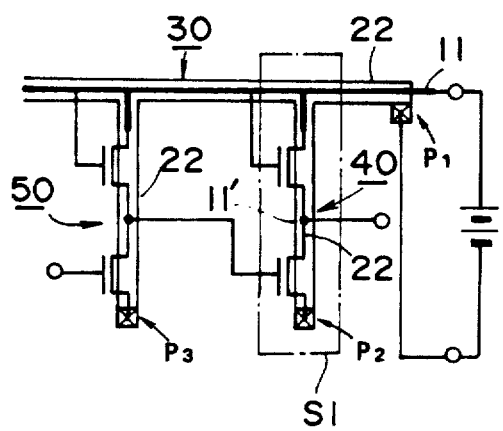
FIGS. 2 and 3 are equivalent circuit diagrams showing different embodiments of the application of the present invention to the integrated circuit shown in FIG. 1.
Figure 3:
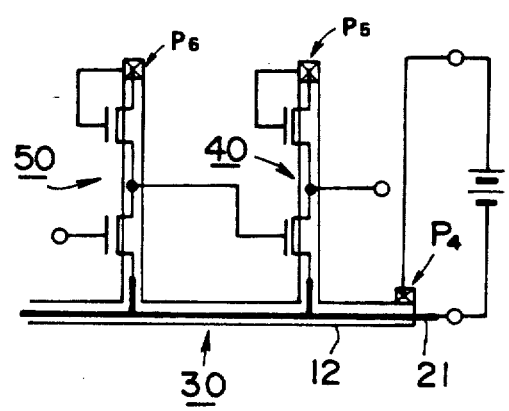
Figure 4:
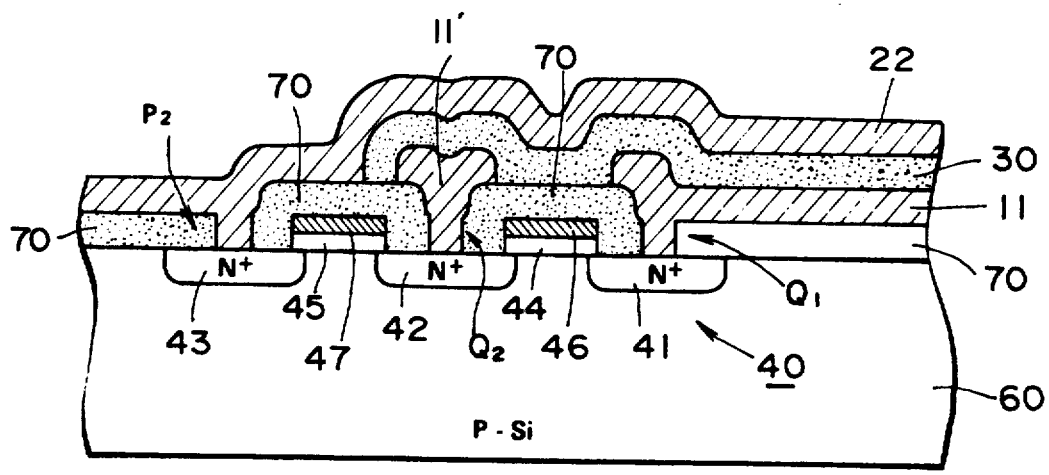
FIG. 4 is a sectional view showing schematically one part of the embodiment shown in FIG. 2.

FIG. 1 illustrates an example of a semiconductor integrated circuit in the form of an inverter that comprises MOS FET pairs 40 and 50. According to the invention, a power source side wire 10 and an earth side wire 20 provided in the inverter are formed in lamination to be disposed in parallel with each other, and a suitable dielectric substance 30 is interposed between the wires 10 and 20 so as to form positively a capacitance C. The invention may be executed in two different ways as shown in FIGS. 2 and 3. FIG. 2 illustrates one embodiment wherein the power source side wire is provided in a first layer (the wire in the first layer is designated by 11), while the earth side wire is provided in a second layer (the wire in the second layer is designated by 22) with a dielectric substance 30 interposed therebetween. The connection between the earth side wire 22 in the second layer and the earth electrode of the power source and the source electrodes of the MOS FET pairs 40 and 50, which are held at earth potential, are carried out in three-dimensional manner through contact holes $P_1$, $P_2$ and $P_3$, respectively. FIG. 4 illustrates schematically a cross-sectional construction of the circuit shown in FIG. 2, particularly of a circuit portion indicated by S1 which is related to the MOS FET pair 40.

The connection construction shown in FIG. 4 will now be described in detail. MOS FET pair 40 comprises three N+ diffusion layers 41, 42 and 43 formed in a semiconductor substrate (P-Si) 60 assumed to be of P type, gate forming insulating layers 44 and 45 deposited in channel forming regions between the N+ diffusion layers 41, 42 and 43, and gate forming electrode layers 46 and 47 which are made of, for instance, polysilicon and deposited on the insulating layers 44 and 45, respectively. The upper surface of the above described construction is evenly coated by an insulating layer 70 made of, for instance, $SiO_2$. Then contact holes $Q_1$ and $Q_2$ are formed through the insulating layer 70 at positions overlying the N+ diffusion layers 41 and 42. Conductive layers 11 and 11' made of, for instance, aluminum to constitute the first connection layer are selectively deposited through the contact holes $Q_1$ and $Q_2$ for connecting the layers 11 and 11' electrically with the N+ diffusion layers 41 and 42, respectively. The connection layer 11 corresponds to the power source side connection layer, while the connection layer 11' corresponds to a junction portion between the MOS FET pair 40 (in FIG. 2) which is operable as an output terminal of an inverter circuit. A dielectric substance layer 30 made of, for instance, $SiO_2$ is further deposited over the connection layers 11 and 11', and a contact hole $P_2$ is provided through the layer 30 (the contact hole $P_2$ may otherwise be provided after the deposition of the insulating layer 70) at a position overlying the N+ diffusion layer 43 which is operable as a source electrode of the MOS FET pair 40 held in earth potential. Then an earth side connection layer 22 made of, for instance, aluminum and constituting the second layer is deposited entirely so that the layer 22 is electrically connected with the N+ diffusion layer 43 through the hole $P_2$. It should be noted that the earth side connection layer 22 is laminated in parallel with the power source side connection layer 11 with the dielectric substance layer 30 interposed therebetween. Furthermore, the opposing surfaces of the power source side connection layer 11 and the earth side connection layer 22 are positively increased so as to provide a required capacitance between the two layers.

On the other hand, the embodiment shown in FIG. 3 is constructed as follows. At the time of laminating power source wires 10 and 20, the earth side wire is formed into a first layer (earth side wire formed in the first layer is designated by 21), while the power source side wire is formed into a second layer (power source side wire formed into the second layer is designated by 12) with a dielectric substance 30 interposed between the first and second layers. The connection of the power source side wire 12 disposed in the second layer with the power source electrode and also with the drain electrodes of the MOS FET pairs 40 and 50, which are held at a power source potential, are carried out in a three-dimensional manner through contact holes $P_4$, $P_5$ and $P_6$. It is apparent that the above described connection construction of the embodiment can be realized in a similar manner as those described with reference to FIG. 4, and further description thereof is omitted for avoiding redundancy.

An application of the present invention to a semiconductor integrated circuit in the form of a dynamic RAM will now be described.

Figure 5:
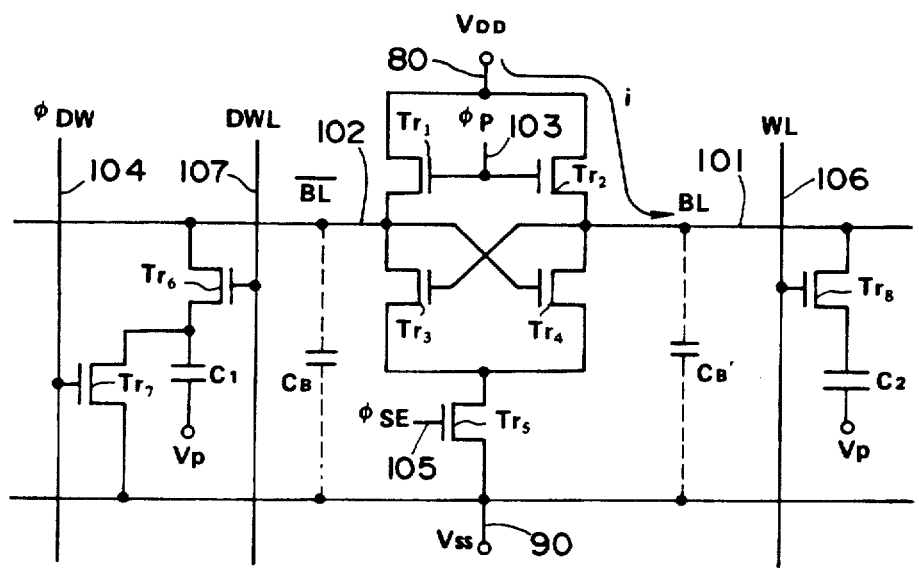
FIG. 5 is a circuit diagram showing one part of an ordinary dynamic RAM constituting an example of a semiconductor integrated circuit.

FIG. 5 is a circuit diagram showing an ordinary construction of a sensing amplifier of the dynamic RAM. The amplifier circuit comprises MOS transistors $Tr_1$ through $Tr_4$ used for providing a flip-flop circuit, MOS transistors $Tr_5$ and $Tr_7$ of sensing use, a MOS transistor $Tr_6$ used for switching dummy cell, a MOS transistor $Tr_8$ used for switching dummy cell, a storing capacitor $C_1$ for the dummy cell, a storing capacitor $C_2$ for the memory cell, and stray capacitances $C_B$ and $C_B'$. In the circuit shown in FIG. 5, a power source line 80 is held at a power source potential $V_{DD}$, another power source line 90 is held at a power source potential $V_{SS}$, bit lines 101 and 102 are held at opposite potentials BL and $\overline{BL}$, a dummy cell reset signal $\phi_{DW}$ is applied to a signal line 104, a sensing operation start signal $\phi_{SE}$ is applied to a signal line 105, a memory cell switching signal WL is applied to a signal line 106, and a dummy cell switching signal DWL is applied to a signal line 107.

Figure 6:
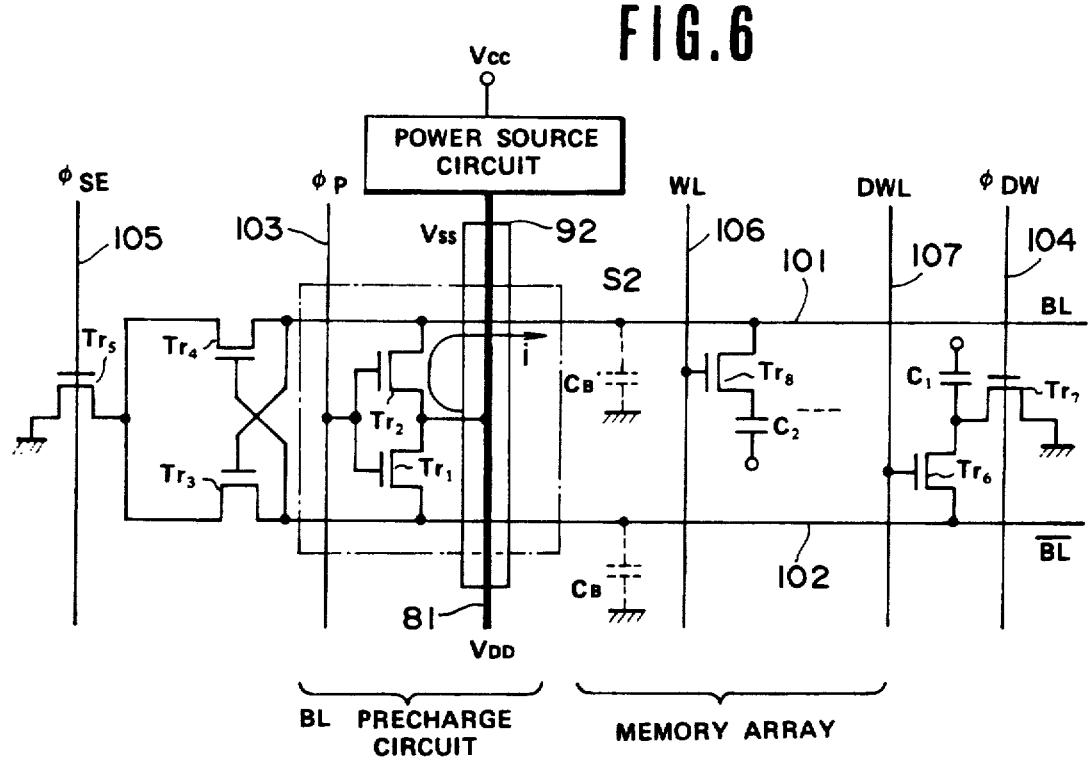
FIG. 6 is an equivalent circuit diagram showing the connection of power source lines in the dynamic RAM shown in FIG. 5, which constitutes still another embodiment of the invention.
Figure 7:
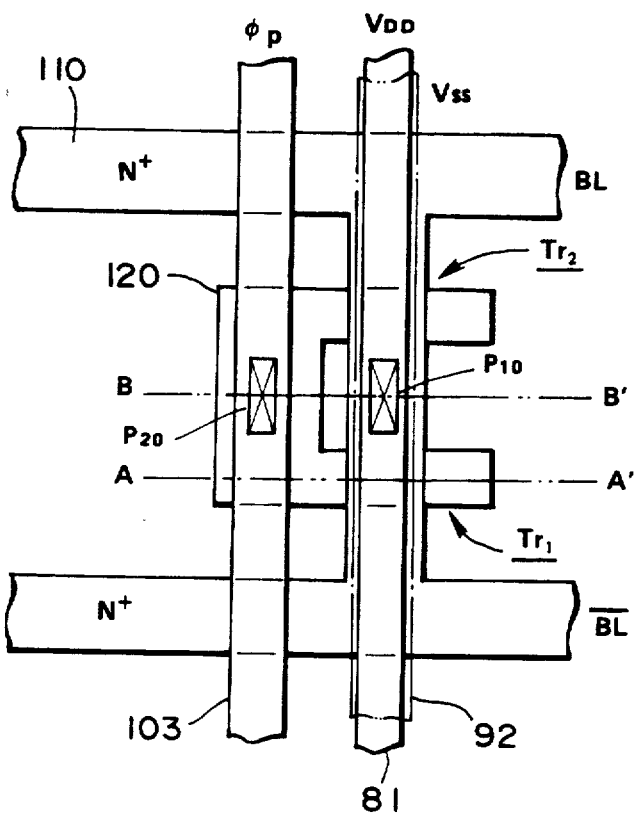
FIG. 7 is a plan view showing important part of the embodiment shown in FIG. 6.

For the convenience of application of the present invention, the circuit shown in FIG. 5 is rearranged as shown in FIG. 6. In a practical dynamic RAM, the circuit shown in FIG. 6 is repeatedly arranged vertically along the lines 103, 104, 105, 106 and 107 into a required number of stages. In the shown embodiment, the power source lines 80 and 90 in FIG. 5 are formed into a laminated construction. It is assumed that the power source line at the potential $V_{DD}$ is disposed in the first layer (the line in the first layer is designated by 81), while the power source line at the potential $V_{SS}$ is arranged in the second layer (the line in the second layer is designated by 92). FIG. 7 is a plan view showing the laminated construction of the power source lines provided for a precharge circuit for the bit lines, which is surrounded by one dot dash line and indicated by $S_2$ in FIG. 6, and FIGS. 8(A) and 8(B) are sectional views taken along the lines A—A' and B—B' in FIG. 7.

The embodiment will now be described in detail with reference to FIGS. 6, 7, 8(A) and 8(B).

Figure 8A:
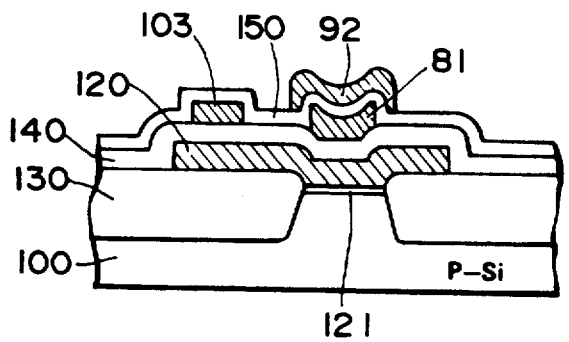
FIGS. 8(A) and 8(B) are sectional views taken along the lines A—A' and B—B— in FIG. 7.
Figure 8B:
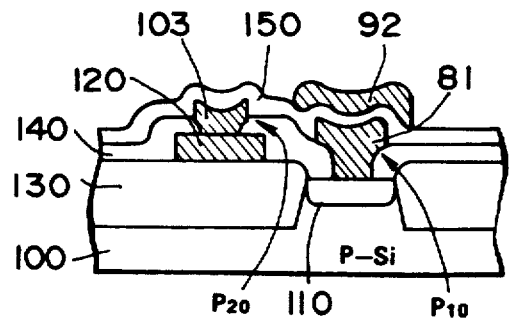

As is apparent in these drawings, each of the MOS transistors $Tr_1$ and $Tr_2$ is made of a P-type semiconductor substrate (P-Si) 100 in which a field oxide layer 130 is buried, a gate oxide layer 121 and a gate electrode layer 120 (see FIG. 8(A)) consisting of a polysilicon or else successively formed on the substrate 100, and an N+ diffusion layer 110 (see FIGS. 7 and 8(B)) which is formed by ion-injecting an impurity such as As while utilizing the gate electrode layer 120 as a mask. In the shown embodiment, the entire surface is then covered by an insulating layer 140 of, for instance, $SiO_2$ (CVD-$SiO_2$), and the power source line 81 in the form of a first layer made of a metal such as Al and to be held at the power source voltage $V_{DD}$ and a signal line 103 to which a bit line precharging signal $\phi_p$ is applied are selectively deposited over the insulating layer 140 (see FIGS. 7 and 8(A)). A layer 150 of a dielectric substance such as $SiO_2$ (CVD-$SiO_2$) is then formed over the entire surface, and the power source line 92 in the form of the second layer made of a metal such as Al and to be held at the power source voltage $V_{SS}$ is deposited on the dielectric substance layer 150 such that the power source line 92 extends in parallel with the power source line 81 provided in the form of the first layer. As is apparent in FIG. 8(B), the power source line 81 is electrically connected through a contact hole $P_{10}$ with the N+ diffusion layer 110 serving as a junction point between the drain electrode and the source electrode of the transistors $Tr_1$ and $Tr_2$, while the signal line 103 is electrically connected through a contact hole $P_{20}$ with a junction point between the gate electrodes of the transistors $Tr_1$ and $Tr_2$. With the above descried connection construction, a circuit equivalent to that shown in FIG. 6 is realized.

In consideration of electrical properties of the dynamic RAM, the length of the power source line 80 held at a potential $V_{DD}$ increases in accordance with the size of the dynamic RAM. In cases of 1M bit dynamic RAM, the length of the power source line 80 will be approximately 10 ml with a width of 2 microns. Assuming that the power source line is made of Al, the resistance of the line 81 is expressed to be $$\begin{aligned}R &= (l \cdot \rho)/S = (1 \times 0.05)/2 \times 10^{-4} \\ &= 250 \text{ ohms}\end{aligned}$$

In case where approximately 1024 bit lines of 1M bit dynamic RAM are charged to a high voltage required for the sensing operation of the amplifier, assuming that the stray capacity of each bit line $C_B = C_B' = 500$ fF, the total sum of the stray capacitance becomes 0.5 nF. Thus for charging, under 5 V and within 20 ns, the bit lines from a low voltage resulting from the sensing operation to a high voltage required for resuming the same operation, a charging current of 125 mA is required. When such a heavy current flows through the power source line 80, a voltage drop as described above occurs, thus reducing the power source voltage and elongating cycle time required for the charging operation. Such an adverse effect can be eliminated by a connection construction of the power source lines a shown in FIG. 6 wherein the power source lines 81 and 92 are laminated with each other so that a large capacitance of, for instance, 5 pF which is 10 times larger than 500 fF obtained for each bit line, is formed between the power source lines 81 and 92. By charging the bit lines from the capacitance without effects of the voltage drop of the power source lines, a high speed and noiseless charging of the same can be realized.

FIG. 9 is a time chart showing conditions of various signals during the sense operation of the dynamic RAM. According to the embodiment, it is possible to increase forcibly the power source potential $V_{SS}$ as shown by one-dot-dash line CL in FIG. 9 in synchronism with a precharging signal $\phi_p$ of the bit lines so that the electric charge in the capacitance between the power source lines 81 and 92 is effectively utilized for charging the bit lines. Such an operation can be realized by connecting the power source line 92 at a potential $V_{SS}$ with a suitable power source not shown for increasing the potential of the power source line 92 for a time synchronized with the precharging signal $\phi_p$.

Assuming that a current flowing through the power source lines to the bit lines, or more generally to the semiconductor integrated circuit, is i, a peak value of the current is $i_p$, and a duration time of ½ peak value of the current is $t_p$, the following relation holds between a voltage drop $\Delta V$ transiently caused by the current $i_p$ and the capacitance C provided between the laminated power source lines $$\Delta V = (i_p \times t_p)/C \quad (1)$$

Thus, by selecting the voltage drop $\Delta V$ in a range allowable for realizing a stable operation of the semiconductor integrated circuit, the capacitance C for assuring stable operation of the integrated circuit is determined from the following relation $$C \geq (i_p \times t_p)/\Delta V \quad (2)$$

That is, the required capacitance C is determined by firstly calculating the allowable voltage drop $\Delta V$, and then by substituting the value in equation (2). After the value of the capacitance C has been thus determined, the widths and lengths and the layout of the power source lines as well as the thickness of the dielectric substance and the material of the related elements may be determined in accordance with the semiconductor integrated circuit. Herein, the values of $i_p$ and $t_p$ in equation (2) can be determined comparatively easily from the specific feature of the semiconductor insulated circuit.

When it is assumed that the power source voltage is held at 5 (V), the allowable voltage drop $\Delta V$ is selected to be 1 (V) being 20% of the power source voltage, the peak value $i_p$ of the power source current is 125 (mA), and the duration time $t_p$ of the ½ peak value is 2 (ns), then the capacitance C is calculated as follows.

$$\begin{aligned}C &= (i_p \times t_p)/\Delta V = (125 \times 2)/1 \\ &= 0.25 \text{ (nF)}\end{aligned}$$

This indicates that a stable operation of the integrated circuit can be assured for a capacitance C more than 0.25 nF.

For the realization of the aforementioned value of the capacitance C, the semiconductor integrated circuit may be designed such that the width and the length of the power source lines are 100 microns and 100 (mm), respectively, and a dielectric substance of $SiO_2$ is interposed between the power source layers at a thickness of approximately 1.0 micron. In this manner, a capacitance C of 0.35 (nF) which is sufficiently larger than the above described value 0.25 (nF) can be obtained and it is confirmed that the advantageous features of the present invention can be realized by the semiconductor integrated circuit of the above descried design.

In case where the condition of the voltage drop becomes more strict and a value of 0.5 (V) corresponding to 10% of the power source voltage 5 (V) is selected to be the limiting value $\Delta V$, the required value of the capacitance C becomes $$C = (125 \times 2)/0.5 = 0.5 \; (nF)$$

and hence the design of the semiconductor integrated circuit is changed in accordance with the value of the capacitance C.

It should be noted that the condition related to the limiting value $\Delta V$ of the voltage drop is varied depending on the size and the kind of the semiconductor integrated circuit. Ordinarily, the limiting value $\Delta V$ of approximately 50% of the power source voltage is utilized for determining the required value of the capacitance C, and in case where the condition becomes more strict, a limiting value $\Delta V$ of 20% or 10% of the power source voltage is selected thereby determining the capacitance C.

FIG. 10 illustrates a relation between the power source current i and the limiting value of the voltage drop in various conditions.

Although in the above described construction, it has been assumed that the power source lines laminated in parallel are made of a metal such as aluminum, either one of the power source lines may otherwise be made of polysilicon or polycide which is used for the gate electrode of MOS transistors.

The dielectric substance disposed between the power source lines is not necessarily restricted to $SiO_2$ as described above, but many other substances having higher dielectric constants, such as nitrides and $Ta_2O_5$, may otherwise be used for increasing the capacitance while maintaining the thickness of the dielectric substance at a constant value.

The invention may otherwise be applied to a semiconductor integrated circuit of a multilayer connection construction. In a case where the construction has three layers, a connection layer 211 of a potential $V_{CC}$, a dielectric substance layer 221, another connection layer 212 of a potential $V_{SS}$, another dielectric substance layer 222, and still another connection layer 213 of a potential $V_{CC}$ are deposited in this order on a substrate 200 as schematically illustrated in FIG. 11. In the shown construction, a capacitance $C_{10}$ is formed between the connection layers 211 and 212, and another capacitance $C_{20}$ is formed between the connection layers 212 and 213. The multilayer integrated circuit of the above descried construction can exhibit advantageous features similar to those of the embodiments described hereinbefore. Of course, the potentials of the connection layers in FIG. 11 may be reversed to each other, and it is apparent that the invention can be applied to multilayer integrated circuits having more than three layers.

What is claimed is:

1. A semiconductor integrated circuit, comprising:
   a semiconductor substrate;
   a dynamic RAM memory cell array having bit lines mounted on said substrate;
   a power source line and a ground line, mounted on said substrate, for supplying an internal power supply voltage; and
   a charging circuit, mounted on said substrate, for charging the bit lines of the memory cell array at said given voltage for a data sensing operation;
   said power source line and said ground line being disposed one over the other in a laminated manner along their length with a layer of dielectric substance located between said power source line and said ground line to form a capacitance element having a predetermined capacitance value that prevents said internal power supply voltage from dropping below a given voltage.

2. A semiconductor integrated circuit according to claim 1, wherein said power source line and said ground line are composed of aluminum.

3. A semiconductor integrated circuit according to claim 1, wherein said charging circuit includes at least one active element, and one of said power source line and said ground line is composed of aluminum and the other of said power source line and said ground line is composed of the same material as said active element.

4. A semiconductor integrated circuit according to claim 3, wherein said active element includes one of the compounds from the group consisting of polysilicon and polycide.

5. A semiconductor integrated circuit according to claim 1, wherein said dielectric substance is $SiO_2$.

6. A semiconductor integrated circuit according to claim 1, wherein said dielectric substance includes one of the compounds from the group consisting of nitrides and $Ta_2O_5$.

7. A method of producing an integrated circuit on a semiconductor substance, comprising the steps of:
   a forming a dynamic RAM memory cell array having bit lines;
   forming a charging circuit for charging the bit line of said memory cell array at a given voltage for data sensing;
   forming a power source line having an internal power supply voltage and a ground line one over the other in a laminated manner along their length with a layer of dielectric substance being disposed between said power line and said ground line, including the substep of forming a capacitance element having a predetermined capacitance value that prevents said internal power supply voltage from dropping below a given voltage with the laminated structure.

8. A semiconductor integrated circuit, comprising:
   a semiconductor substrate;
   a dynamic random access memory cell array having bit lines mounted on said substrate;
   a precharge circuit, mounted on said substrate, for charging the bit lines of the memory cell array;
   a power buss mounted on said substrate, for supplying a power supply voltage to the precharge circuit; and
   a ground buss mounted on said substrate;
   wherein said power buss and said ground buss are disposed one over the other in a laminated manner along a majority of the length of said power buss with a layer of a dielectric substance being interposed therebetween so that said power buss, said ground buss and said dielectric substance form a capacitance element having a predetermined capacitance value that prevents said power supply voltage from dropping below a given voltage during a precharging operation.

9. A semiconductor integrated circuit according to claim 8, wherein said power buss and said ground buss are composed of aluminum.

10. A semiconductor integrated circuit according to claim 8, wherein said precharge circuit includes at least one active element, and one of said power buss and said ground buss is composed of aluminum and the other of said power buss and ground buss is composed of a material identical to said active element such as polysilicon or polycide.

11. A semiconductor integrated circuit according to claim 8, wherein said dielectric substance is SiO$_2$.

12. A semiconductor integrated circuit according to claim 8, wherein said dielectric substance is composed of a nitride or Ta$_2$O$_5$ having a high dielectric constant.

13. A semiconductor integrated circuit, comprising:
a semiconductor substrate;
a dynamic RAM memory cell array having bit lines mounted on said substrate;
a precharge circuit, mounted on said substrate, for precharging the bit lines of the memory cell array;
a power source line mounted on said substrate, for supplying an internal power supply voltage to the precharge circuit; and
a ground line mounted on said substrate;
wherein said power source line and said ground line are disposed one over the other in a laminated manner along their length with a layer of dielectric substance being interposed therebetween so that said power source line, said ground line, and said dielectric substance form a capacitance element having a predetermined capacitance value that prevents said internal power supply voltage from dropping below a given voltage.

14. A semiconductor integrated circuit according to claim 13, wherein said power source line and said ground line are composed of aluminum.

15. A semiconductor integrated circuit according to claim 13, wherein said precharge circuit includes at least one active element, and one of said power source line and said ground line is composed of aluminum and the other of said power source line and said ground line is composed of a material identical to said active element such as polysilicon or polycide.

16. A semiconductor integrated circuit according to claim 13, wherein said dielectric substance is SiO$_2$.

17. A semiconductor integrated circuit according to claim 13, wherein said dielectric substance is composed of either a nitride or Ta$_2$O$_5$ having a high dielectric constant.

18. A semiconductor integrated circuit, comprising:
a semiconductor substrate;
a dynamic RAM memory cell array having bit lines mounted on said substrate;
a charging circuit, mounted on said substrate, for charging the bit lines of the memory cell array for data sensing;
a power source line mounted on said substrate, for supplying an internal power supply voltage to the charging circuit; and
a ground line mounted on said substrate;
wherein said power source line and said ground line are disposed one over the other in a laminated manner along their length with a layer of a dielectric substance being interposed therebetween, the laminated structure forming a capacitance element having a predetermined capacitance value that prevents said internal power supply voltage from dropping below a given voltage.

19. A semiconductor integrated circuit according to claim 18, wherein said power source line and said ground line are composed of aluminum.

20. A semiconductor integrated circuit according to claim 18, wherein said charging circuit includes at least one active element, and one of said power source line and said ground line is composed of aluminum and the other of said power source line and said ground line is composed of a material identical to said active element such as polysilicon or polycide.

21. A semiconductor integrated circuit according to claim 18, wherein said dielectric substance is SiO$_2$.

22. A semiconductor integrated circuit according to claim 18, wherein said dielectric substance is composed of either a nitride or Ta$_2$O$_5$ having a high dielectric constant.

23. A semiconductor integrated circuit, comprising:
a semiconductor substrate;
a dynamic RAM memory cell array having bit lines mounted on said substrate;
a charging circuit, mounted on said substrate, for charging the bit lines of the memory cell array for data sensing;
a conductive line mounted on said substrate, for supplying an internal power supply voltage to the charging circuit; and
a ground line mounted on said substrate;
wherein said conductive line and said ground line are disposed one over the other in a laminated manner along their length with a layer of a dielectric substance being interposed therebetween, the laminated structure forming a capacitance element having a predetermined capacitance value that prevents said internal power supply voltage from dropping below a given voltage.

24. A semiconductor integrated circuit according to claim 23, wherein said conductive line and said ground line are composed of aluminum.

25. A semiconductor integrated circuit according to claim 23, wherein said charging circuit includes at least one active element, and one of said conductive line and said ground line is composed of aluminum and the other of said conductive line and said ground line is composed of a material identical to said active element such as polysilicon or polycide.

26. A semiconductor integrated circuit according to claim 23, wherein said dielectric substance is SiO$_2$.

27. A semiconductor integrated circuit according to claim 23, wherein said dielectric substance is composed of either a nitride or Ta$_2$O$_5$ having a high dielectric constant.

* * * * *